United States Patent [19]

Ishibashi

[11] Patent Number: 5,811,831
[45] Date of Patent: Sep. 22, 1998

[54] SEMICONDUCTOR DEVICE EXPLOITING A QUANTUM INTERFERENCE EFFECT

[75] Inventor: Akira Ishibashi, Kanagawa, Japan

[73] Assignee: Sony Corporation, Tokyo, Japan

[21] Appl. No.: 719,698

[22] Filed: Sep. 27, 1996

Related U.S. Application Data

[63] Continuation of Ser. No. 501,907, Jul. 13, 1995, abandoned, which is a continuation of Ser. No. 140,456, Oct. 25, 1993, abandoned.

[30] Foreign Application Priority Data

Oct. 31, 1992 [JP] Japan ................................ 4-316531

[51] Int. Cl.⁶ .................. H01L 29/06; H01L 31/0328; H01L 31/0336; H01L 31/109
[52] U.S. Cl. .................. 257/14; 257/27; 257/192; 257/328; 257/329; 257/270
[58] Field of Search .................. 257/12, 20, 24–27, 257/192, 195, 252, 328, 270, 284, 14, 194, 329

[56] References Cited

U.S. PATENT DOCUMENTS

| | | | |
|---|---|---|---|
| 4,581,621 | 4/1986 | Reed | 257/20 |
| 4,916,499 | 4/1990 | Kawai | 257/192 |

FOREIGN PATENT DOCUMENTS

| | | | |
|---|---|---|---|
| 1171277 | 7/1989 | Japan | 257/252 |
| 1225175 | 9/1989 | Japan | 257/27 |
| 2156681 | 6/1990 | Japan | 257/192 |
| 2161780 | 6/1990 | Japan | 257/25 |
| 4125966 | 4/1992 | Japan | 257/25 |

OTHER PUBLICATIONS

Onda et al. "Striped Channel Field Effect Transistor With Modulation Doped Structure," IEDM, 1989, pp. 125–128.

*Primary Examiner*—Wael Fahmy
*Assistant Examiner*—Howard Weiss
*Attorney, Agent, or Firm*—Hill & Simpson

[57] ABSTRACT

A semiconductor device exploiting a quantum interference effect is disclosed. The device comprises: a semiconductor body; n−1 (n≧3) rods of forbidden regions extending along one direction, the forbidden regions being rotationally asymmetric around the one direction and being changeable in cross sectional area; a channel region consisting of a plurality of elemental channel regions, the forbidden regions dividing the channel region into the plurality of elemental channel regions, each of the elemental channel regions forming a closed circuit and being defined around each of the forbidden regions, the channel region being multiply connected with connectivity of n; and source and drain electrodes electrically connected to one and another ends of the channel region along the one direction.

12 Claims, 7 Drawing Sheets

SEMICONDUCTOR DEVICE EXPLOITING A QUANTUM INTERFERENCE EFFECT

This is a continuation of application Ser. No. 08/501,907 filed Jul. 13, 1995, now abandoned, which was a continuation of Ser. No. 08/140,456 filed Oct. 25, 1993, now abandoned.

BACKGROUND OF THE INVENTION

1. Field of the Invention

This invention relates to a semiconductor device exploiting a quantum interference effect and, more particularly, to such a quantum interference semiconductor device using a channel of a multiply connected structure.

2. Description of the Prior Art

Channels in existing semiconductor devices, such as JFET, MISFET, MESFET, HEMT (high electron mobility transistor), HBT (heterojunction bipolar transistor), HET (hot electron transistor) and so on, have a simply connected structure from a topological viewpoint. Since such semiconductor devices effect on-off actions by controlling conduction and non-conduction of the channel, they are available only for simple operations.

Recently, various quantum interference semiconductor devices utilizing an interference of electrons have been proposed for realizing more complicated and advanced operations (see, for example, Technical Digest of IEDM 86, pp. 76–79).

However, major ones of quantum interference semiconductor devices heretofore proposed use a channel of a doubly connected structure, and cannot induce an advanced interference effect.

In addition, it is a matter of course that such a quantum interference semiconductor device could not vary the connectivity of its channel.

OBJECTS AND SUMMARY OF THE INVENTION

It is therefore an object of the invention to provide a semiconductor device exploiting a quantum interference effect that induces an advanced interference effect by varying the connectivity of its channel having a multiply connected structure.

Another object of the invention is to provide a semiconductor device exploiting a quantum interference effect that induces various interference patterns and an advanced interference effect when used in a magnetic field.

According to an aspect of the invention, there is provided a semiconductor device exploiting a quantum interference effect, comprising:

(a) a semiconductor body;
(b) n−1 (n≧3) rods of forbidden regions extending along one direction, the forbidden regions being rotationally asymmetric around the one direction and being changeable in cross sectional area;
(c) a channel region consisting of a plurality of elemental channel regions, the forbidden regions dividing the channel region into the plurality of elemental channel regions, each of the elemental channel regions forming a closed circuit and being defined around each of the forbidden regions, the channel region being multiply connected with connectivity of n; and
(d) source and drain electrodes electrically connected to one and another ends of the channel region along the one direction.

The above, and other, objects, features and advantage of the present invention will become readily apparent from the following detailed description thereof which is to be read in connection with the accompanying drawings.

DESCRIPTION OF THE PREFERRED EMBODIMENTS

In a quantum interference semiconductor device using a channel of a structure multiply connected with connectivity of n defined by n−1 (n≧3) rods of forbidden regions, the number of paths that carriers can take in the channel is $2^{n-1}$ in total because, for each of n−1 rods of the forbidden regions, there are two kinds of paths which surround and do not surround the forbidden region. One of $2^{n-1}$ paths is a simply connected path which surrounds no forbidden region. The other $2^{n-1}-1$ paths are multiply connected paths. Since there are paths as many as $2^{n-1}-1$ that carriers can take in the channel, it is possible to obtain various interference patterns and to obtain an advanced interference effect if the quantum interference semiconductor is used, for example, in a magnetic field.

When successive numbers 1 to $2^{n-1}$ are assigned to the $2^{n-1}$ paths in sequence from one having the smallest connectivity; and a wave function corresponding to an ith path is represented by $\phi_i$, then the wave function $\psi_i$ can be expressed by the equation shown below. Note, however, that the z-axis direction is chosen as the running direction of the carriers and that a magnetic field B is applied in the z-axis direction.

$$\phi_i = c_i \exp(i\phi_i) \cdot \exp(ikz) \quad (i=1, 2, \ldots, 2^{n-1}) \quad (1)$$

where $c_i$ is a coefficient, $\phi_i$ is a phase, and k is the wave number.

If one end and the other end of the channel are a source and a drain, respectively, then carriers run in the z-axis direction from the source toward the drain. In this case, the total wave function $\psi$ at the drain is expressed by superposition of $\phi_i$ as follows:

$$\psi = \sum_i \phi_1 = \sum_i c_i \exp(i\phi_i) \cdot \exp(ikz) \quad (2)$$

where $\Sigma$ is the sum obtained by changing i from 1 to $2^{n-1}$.

Then the current observed at the drain, that is, the drain current, is expressed by using equation (2) as follows:

$$J \sim |\psi|^2 \quad (3)$$

Since $|\psi|^2$ is a function of the phase $\phi_i$, the drain current J is also a function of the phase $\phi_i$. This means that, by changing $\phi_i$, the drain current J can be changed.

The phase $\phi_i$ in equation (2) has values explained below. Here, numbers from 1 to n−1 are assigned to n−1 forbidden regions, and a jth forbidden region has a cross sectional area $S_j$. Note that the cross sectional area $S_j$ here means that of an effective forbidden region including a depletion layer because when a depletion layer is produced around a built-in forbidden region, the entirety of the built-in forbidden region and the depletion layer behaves as an effective forbidden region.

Phase of the wave function corresponding to a path surrounding no forbidden region is:

$$F_1 = 0$$

Phase of a wave function corresponding to a path surrounding one forbidden region is expressed by:

$$\phi_i = BS_j$$

Phase of a wave function corresponding to a path surrounding two forbidden regions is expressed by:

$$\phi_i = B(S_k + S_l)$$

Similarly, phase of a wave function corresponding to a path surrounding three or more forbidden regions is obtained as a product of the magnetic field B and the sum of cross sectional areas of these forbidden regions.

When forbidden regions and the channel are made of semiconductors of opposite conductivity types, pn junctions are made by these forbidden regions and the channel.

Alternatively, when forbidden regions are hollows and Schottky electrodes are made on surfaces of the channel that make inner walls of the hollow forbidden regions, Schottky junctions are made by the Schottky electrodes and the channel. By reverse-biasing these pn junctions or Schottky junctions, depletion layers of the pn junctions or the Schottky junctions can be extended, and cross sectional areas of effective forbidden regions including the depletion layers can be changed responsively. In addition, by uniting a set of arbitrary adjacent forbidden regions by varying cross sectional areas of the forbidden regions, the number of forbidden regions can effectively be decreased. Accordingly, the connectivity of the channel can be decreased, and the drain current shown by equation (3) can be changed. Therefore, by making the value of the drain current in accordance with the connectivity of the channel to correspond to a logic value, a multi-valued logic device, or the like, can be realized.

Biasing of pn junctions or Schottky junctions may be done collectively for the junctions at all forbidden regions, or may be done individually for each junction at each forbidden region. The former collective biasing makes it easy to fabricate an electrode for biasing. The latter individual biasing makes it possible for the device to perform a more complicated operation.

Embodiments of the invention are explained below with reference to the drawings. In all of the drawings of the embodiments, equivalent elements are labeled with the same reference numerals.

Figure 1:
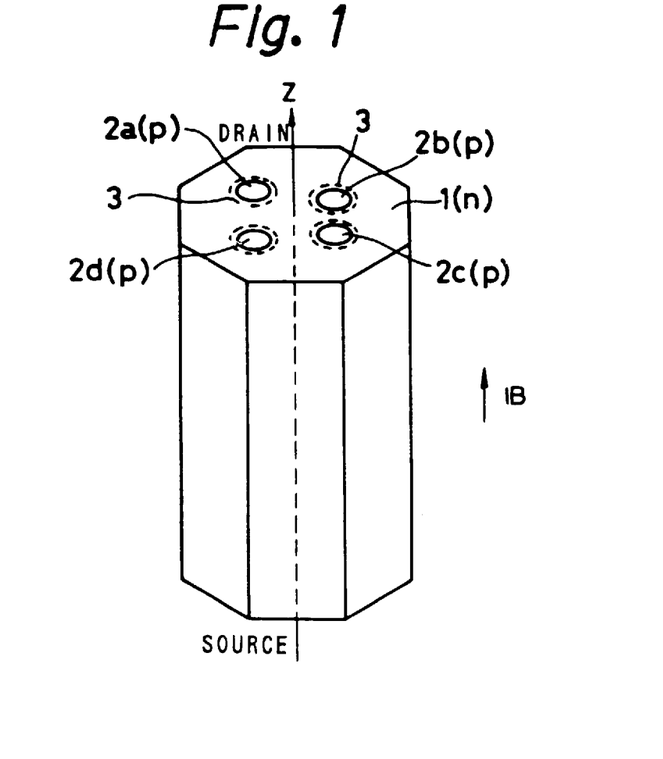
FIG. 1 is a perspective view of a quantum interference semiconductor device according to an embodiment of the invention.
Figure 2:
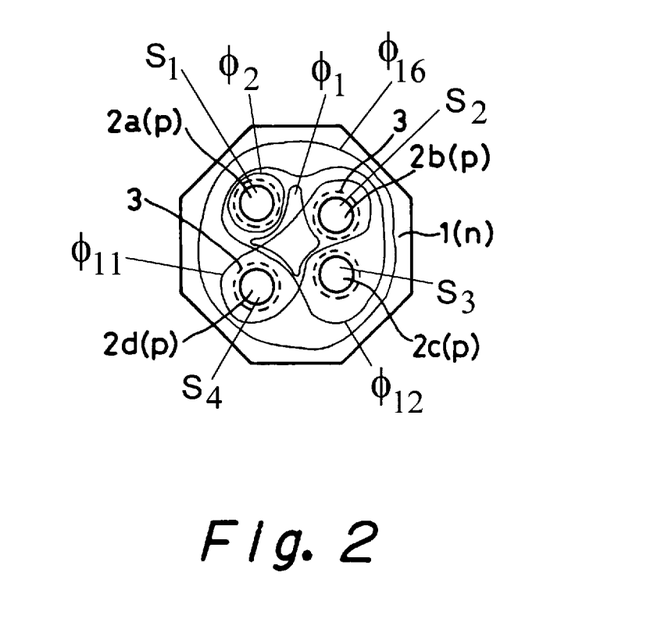
FIG. 2 is a cross sectional view of the quantum interference semiconductor device of FIG. 1, taken along a plane normal to the z axis.

FIG. 1 is a perspective view of a quantum interference semiconductor device according to an embodiment of the invention. FIG. 2 is a cross sectional view of the quantum interference semiconductor device of FIG. 1, taken along a plane normal to the z-axis.

As shown in FIGS. 1 and 2, the quantum interference semiconductor device according to the embodiment has a structure in which four forbidden regions 2a, 2b, 2c and 2d, made of p-type AlGaAs and having an elongated cylindrical geometry extending in the z-axis direction, are buried in a channel 1, made of n-type GaAs and having a regular-octagonal prismatic geometry whose center axis is the z-axis. In other words, the channel 1 in the form of a regular-octagonal prism is formed to surround the four forbidden regions 2a, 2b, 2c and 2d. Since this structure includes four forbidden regions 2a, 2b, 2c and 2d in the channel 1, the channel 1 has a quintuply connected structure.

Diameters of the forbidden regions 2a, 2b, 2c and 2d are chosen to be equal. Distance between the forbidden regions 2b and 2c is chosen to be smaller than the distance between the forbidden regions 2a and 2b and the distance between the forbidden regions 2a and 2d.

In this case, a pn junction in the form of heterojunction is made between a respective one of the forbidden regions 2a, 2b, 2c and 2d made of p-AlGaAs and the channel 1 made of n-type GaAs, and a depletion layer 3 is produced in each pn junction. In this case, electrons exist in the channel 1 alone, and do not stably exist in the forbidden regions 2a, 2b, 2c and 2d and their surrounding depletion layers 3.

Here is, however, a situation that impurity concentration of the p-type AlGaAs constituting the forbidden regions 2a, 2b, 2c and 2d is sufficiently higher than impurity concentration of the n-type GaAs constituting the channel 1 and, hence, that the depletion layers 3 extend only into the channel 1 when respective pn junctions between the forbidden regions 2a, 2b, 2c and 2d and the channel 1 are reverse-biased.

In this embodiment, with reference to FIG. 1, the channel 1 has its source at its lower end and its drain at its upper end, the source being, for example, connected to ground, and a positive voltage being applied to the drain. Then, electrons run through the channel 1 in the z-axis direction from the source toward the drain. In this case, a magnetic field B for controlling an interference of electrons in the channel 1 is applied to the channel 1 in the z-axis direction (see FIG. 1).

Explained below is an operation of the quantum interference semiconductor device according to the embodiment having the above-described structure.

If the quantum interference semiconductor device exhibits the state shown in FIGS. 1 and 2 in its off time, the channel 1 has a quintuply connected structure in this state. In this case, the number of paths that electrons in the channel can take is $2^{5-1}=16$. One of the sixteen paths is a simply connected one which surrounds no forbidden region, four of them are paths each surrounding one forbidden region, six of them are paths each surrounding two forbidden regions, four of them are paths each surrounding three forbidden regions, and the remainder one of them is a path surrounding four forbidden regions. The total wave function $\psi_1$ at the drain in this state is expressed by the following equation:

$$\psi_1 = \sum_{i=1}^{16} c_i \exp(i\phi_i) \cdot \exp(ikz) \quad (4)$$

where the phase $\phi_i$ has values shown below, and cross sectional areas of the forbidden regions 2a, 2b, 2c and 2d including their surrounding depletion layers 3 are $S_1$, $S_2$, $S_3$ and $S_4$, respectively (see FIG. 2).

(1) phase of a wave function corresponding to a path surrounding no forbidden region $\phi_1 = 0$ (2) phases of wave functions corresponding to paths each surrounding one forbidden region $\phi_2 = BS_1$ $\phi_3 = BS_2$ $\phi_4 = BS_3$ $\phi_5 = BS_4$ (3) phases of wave functions corresponding to paths each surrounding two forbidden regions $\phi_6 = B(S_1 + S_2)$ $\phi_7 = B(S_2 + S_3)$ $\phi_8 = B(S_3 + S_4)$ $\phi_9 = B(S_4 + S_1)$ $\phi_{10} = B(S_1 + S_3)$ $\phi_{11} = B(S_2 + S_4)$ (4) phases of wave functions corresponding to paths each surrounding three forbidden regions $\phi_{12} = B(S_1 + S_2 + S_3)$ $\phi_{13} = B(S_2 + S_3 + S_4)$ $\phi_{14} = B(S_3 + S_4 + S_1)$ $\phi_{15} = B(S_4 + S_1 + S_2)$ (5) phase of a wave function corresponding to a path surrounding four forbidden regions $\phi_{16} = B(S_1 + S_2 + S_3 + S_{S4})$.

The carrier paths for phases of wave functions $\phi_1$, $\phi_2$, $\phi_{11}$, $\phi_{12}$ and $\phi_{16}$ are shown in FIG. 2.

The drain current $J_{13}$ at this time is expressed by the following equation:

$$J_1 \sim |\psi_1|^2 \quad (5)$$

Now the respective pn junctions between the forbidden regions 2a, 2b, 2c and 2d and the channel 1 are reverse-biased by applying a negative voltage to the forbidden regions 2a, 2b, 2c and 2d. Then the widths of the depletion layers 3 around the forbidden regions 2a, 2b, 2c and 2d increase. When the value of the voltage to be applied to the forbidden regions 2a, 2b, 2c and 2d is chosen such that the widths of the depletion layers 3 be larger than one half the distance between the forbidden regions 2b and 2c, then the depletion layer 3 around the forbidden region 2b and the depletion layer 3 around the forbidden region 2c merge into one, and the entirety of the forbidden regions 2b and 2c is surrounded by the merged depletion layer 3. As a result, the number of forbidden regions in the channel 1 effectively becomes three, and the connectivity of the channel 1 decreases to four. In this state, the number of paths that electrons can take in the channel 1 is $2^{4-1}=8$.

The total wave function $\psi_2$ at the drain in this state is expressed by the following equation:

$$\psi_2 = \sum_{i=1}^{8} c_i' \exp(i\phi_i') \cdot \exp(ikz) \quad (6)$$

where $c_i'$ is a coefficient, and $\phi_i'$ has values shown below. Note that $S_1'$ is the cross sectional area of the forbidden region 2a including its surrounding depletion layer 3, $S_2'$ is the cross sectional area of the forbidden regions 2b and 2c including their surrounding depletion layers 3, and $S_3'$ is the cross sectional area of the forbidden region 2d including its surrounding depletion layer 3.

(1) phase of a wave function corresponding to a path surrounding no forbidden region $\phi_1' = 0$ (2) phases of wave functions corresponding to paths each surrounding one forbidden region $\phi_2' = BS_1'$ $\phi_3' = BS_2'$ $\phi_4' = BS_3'$ (3) phases of wave functions corresponding to paths each surrounding two forbidden regions $\phi_5' = B(S_1' + S_2')$ $\phi_6' = B(S_2' + S_3')$ $\phi_7' = B(S_3' + S_4')$ (4) phase of a wave function corresponding to a path surrounding three forbidden regions $$\phi_8' = B(S_1' + S_2' + S_3')$$

The drain current $J_2$ at this time is expressed by the following equation:

$$J_2 \sim |\psi_2|^2 \quad (7)$$

It is understood from the foregoing discussion that, by reverse-biasing respective pn junctions between the forbidden regions 2a, 2b, 2c and 2d and the channel 1 to unite the forbidden regions 2b and 2c, the connectivity of the channel 1 decreases from five to four, and the drain current accordingly changes from $J_1$ to $J_2$.

Figure 3:
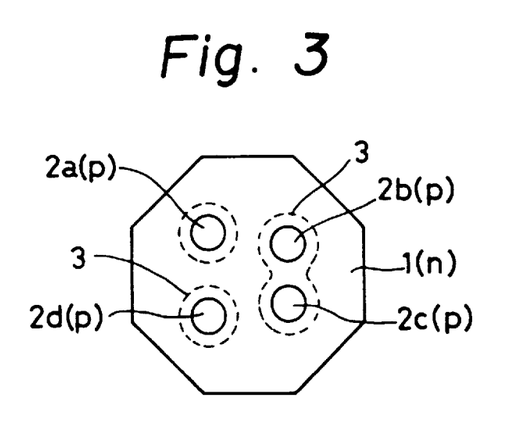
FIG. 3 is a cross sectional view of the quantum interference semiconductor device of FIGS. 1 and 2 for explaining its operation.
Figure 4:
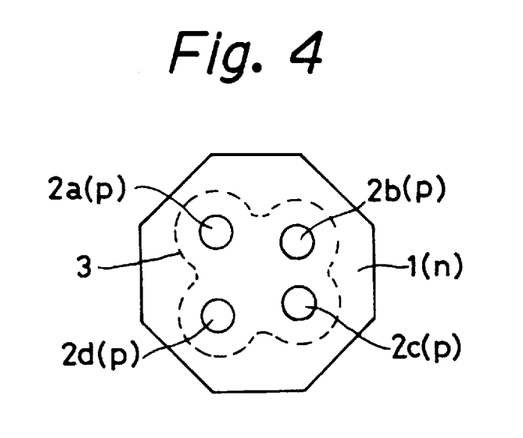
FIG. 4 is a cross sectional view of the quantum interference semiconductor device of FIGS. 1 and 2 for explaining its operation.

When a larger negative voltage is applied to the forbidden regions 2a, 2b, 2c and 2d, the depletion layers 3 around the forbidden regions 2a, 2b, 2c and 2d further extend, and the depletion layers 3 around the forbidden regions 2a, 2b, 2c and 2d merge into one such that the entirety of the forbidden regions 2a, 2b, 2c and 2d is surrounded by the merged depletion layer 3. In this state, since the number of forbidden regions in the channel 1 is effectively one, the connectivity of the channel 1 has decreased to two. Therefore, if the drain current at this time is expressed by $J_3$, the state of FIG. 3, where the connectivity of the channel 1 is four, changes to the state of FIG. 4, where the connectivity of the channel 1 is two, and the drain current thereby changes from $J_2$ to $J_3$.

According to the foregoing embodiment, connectivity of the channel 1 can be changed from 5 to 4, yet to 2, by reverse-biasing the respective pn junctions between the forbidden regions 2a, 2b, 2c and 2d and the channel 1, and the drain current can be changed in steps from $J_1$ to $J_2$, yet to $J_3$. As a result, the quantum interference semiconductor device according to the embodiment can be used as, for example, a multi-valued logic device.

In the foregoing embodiment, the forbidden regions 2a, 2b, 2c and 2d are equal in diameter, and the distance between the forbidden regions 2b and 2c is smaller than that between the forbidden regions 2a and 2b and that between the forbidden regions 2a and 2d. However, sizes of and distances among the forbidden regions 2a, 2b, 2c and 2d may be chosen as desired. Some different examples are shown below.

Figure 5:
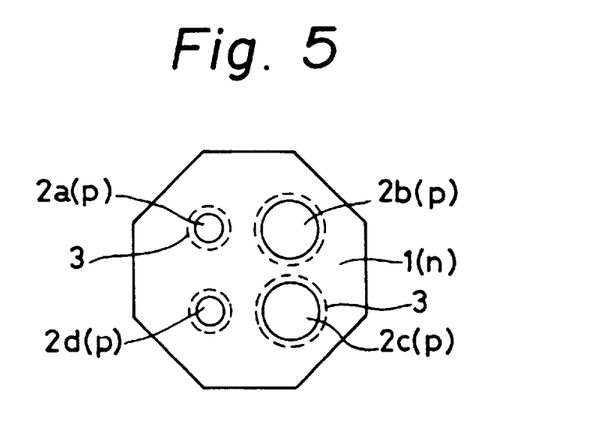
FIG. 5 is a cross sectional view of a quantum interference semiconductor device showing another example of forbidden regions therein.
Figure 6:
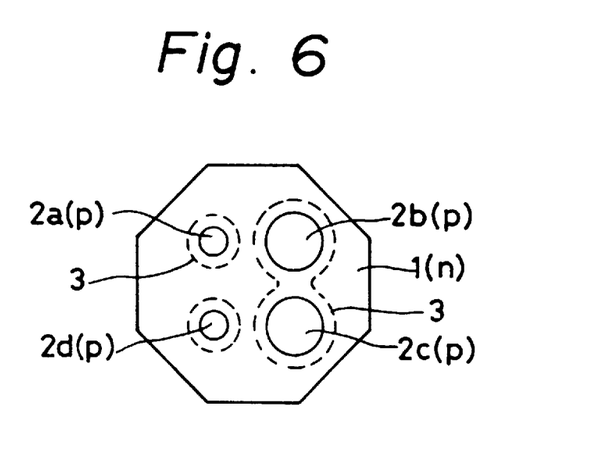
FIG. 6 is a cross sectional view of the quantum interference device of FIG. 5 for explaining its operation.

FIG. 5 shows an example where forbidden regions 2a, 2b, 2c and 2d are located at respective apexes of a square, and the forbidden regions 2b and 2c have a larger diameter than that of the forbidden regions 2a and 2d. A state obtained by reverse-biasing respective pn junctions between the forbidden regions 2a, 2b, 2c and 2d and the channel 1 is shown in FIG. 6. In this case, connectivity of the channel 1 changes from five in FIG. 5 to four in FIG. 6.

In the foregoing examples, all of the pn junctions between the forbidden regions 2a, 2b, 2c and 2d and the channel 1 are biased collectively. However, it is a matter of course that a respective one of the pn junctions may be biased independently of the other pn junctions.

Explained below is a specific structure of the quantum interference semiconductor device using the quintuply connected structure shown in FIGS. 1 and 2.

Figure 7:
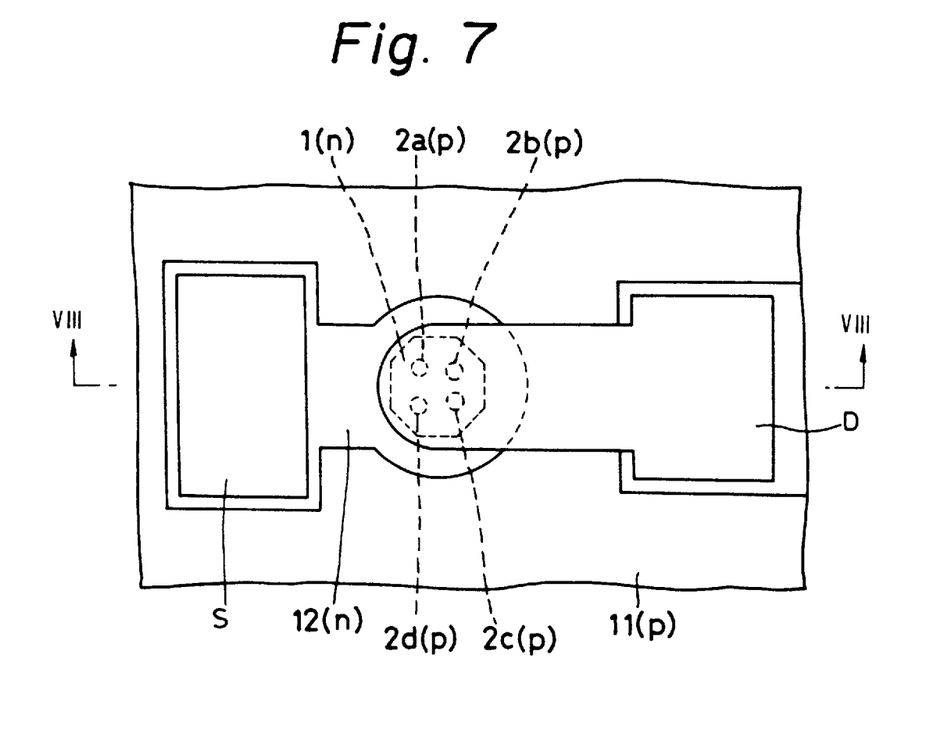
FIG. 7 is a plan view of a specific structure for the quantum interference semiconductor device of FIGS. 1 and 2.
Figure 8:
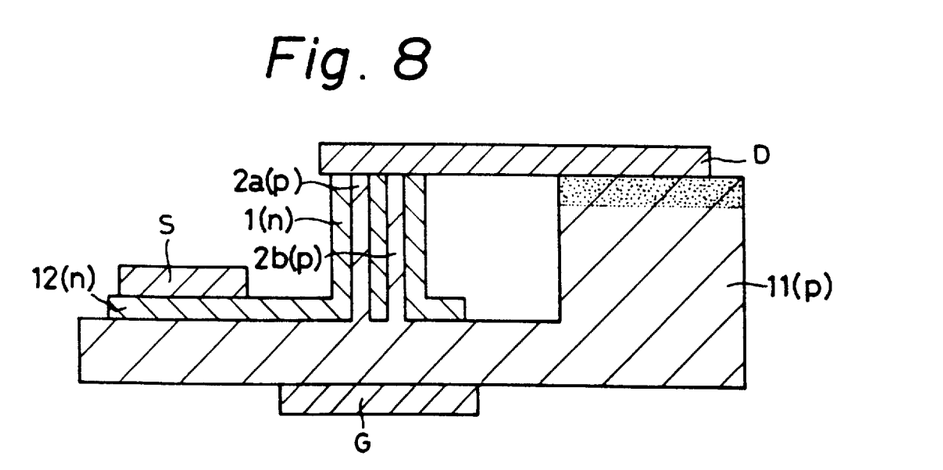
FIG. 8 is a cross sectional view of the quantum interference semiconductor device of FIG. 7, taken along the VIII—VIII line of FIG. 7.

FIG. 7 is a plan view of the quantum interference semiconductor device, and FIG. 8 is a cross sectional view of the quantum interference semiconductor device of FIG. 7, taken along the VIII—VIII line.

In FIGS. 7 and 8, reference numeral 11 denotes a p-type AlGaAs substrate. In this case, four forbidden regions 2a, 2b, 2c and 2d make part of the p-type AlGaAs substrate 11. Reference numeral 12 denotes an n-type GaAs layer. The channel 1 makes part of the n-type GaAs layer 12. S and D denote a source electrode, which is electrically connected to one end of the channel 1, and a drain electrode, which is electrically connected to the other end of the channel 1, made of, for example, an Au/Ge alloy. In this case, a portion of the n-type AlGaAs layer 11 on which one end of the drain electrode D rides or rests (the dotted portion in FIG. 8) has been changed into an insulator to prevent electrical conduction between the end of the drain electrode D and the p-type AlGaAs substrate 11. Provided on the back surface of the p-type AlGaAs substrate 11 in a location corresponding to the forbidden regions 2a, 2b, 2c and 2d is a gate electrode G for applying a voltage to the ends of the forbidden regions 2a, 2b, 2c and 2d to control the connectivity of the channel 1.

The quantum interference semiconductor device shown in FIGS. 7 and 8 can be fabricated in the following process.

Figure 9:
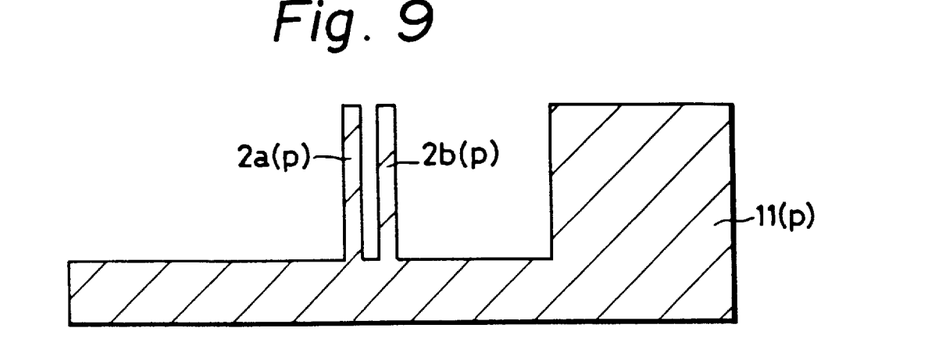
FIG. 9 is a cross sectional view for explaining a method for fabricating the quantum interference semiconductor device of FIGS. 7 and 8.

As shown in FIG. 9, patterning of the p-type AlGaAs substrate 11 is effected by etching to form the forbidden regions 2a, 2b and others made of p-type AlGaAs.

Figure 10:
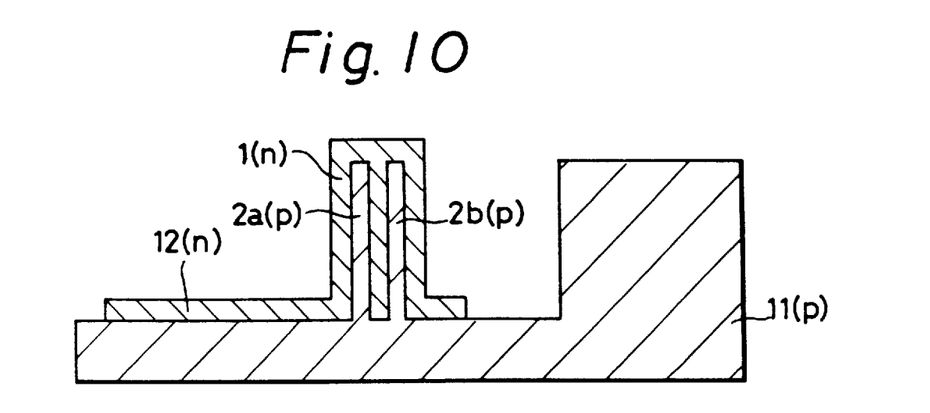
FIG. 10 is a cross sectional view for explaining the method for fabricating the quantum interference semiconductor device of FIGS. 7 and 8.

Next, as shown in FIG. 10, the n-type GaAs layer 12 is epitaxially grown on the entire surface, then followed by patterning thereof by etching to obtain the configuration shown in FIGS. 7 and 8.

Figure 11:
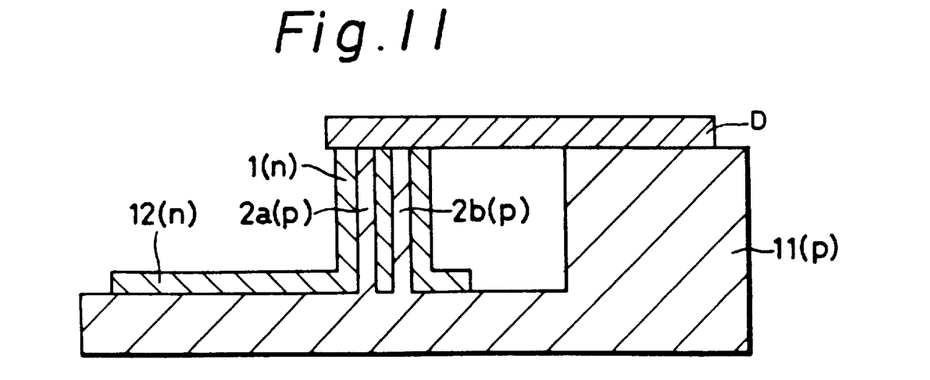
FIG. 11 is a cross sectional view for explaining the method for fabricating the quantum interference semiconductor device of FIGS. 7 and 8.

Next, after a flattening material (not shown) is applied to the recess in the upper surface of the structure shown in FIG. 10 so as to flatten the upper surface, the structure is etched back in a direction normal to the substrate surface. This etching is done until at least upper portions of the forbidden regions 2a, 2b, 2c and 2d are exposed. Next, after an Au/Ge alloy film is provided on the entirety of the flattened surface, patterning of the Au/Ge alloy film is done by etching to obtain the shape of the drain electrode D. After that, the flattening material is removed. FIG. 11 shows this state.

Next, after a mask (not shown) covering at least the drain electrode D is provided, an Au/Ge alloy film is formed on the entire surface, and patterning of the Au/Ge alloy film is effected by etching to obtain a configuration of the source electrode S. After that, as shown in FIGS. 7 and 8, the gate electrode G is formed on the back surface of the p-type AlGaAs substrate 11. Then a desired quantum interference semiconductor device is finished.

The quantum interference semiconductor device shown in FIGS. 1 and 2 and the quantum interference semiconductor device shown in FIGS. 7 and 8 have been described as using forbidden regions 2a, 2b, 2c and 2d made of p-type AlGaAs. However, the p-type AlGaAs forbidden regions 2a, 2b, 2c and 2d may be replaced with mere hollows which behave as forbidden regions. Explained below is a quantum interference semiconductor device using such hollows as forbidden regions.

Figure 12:
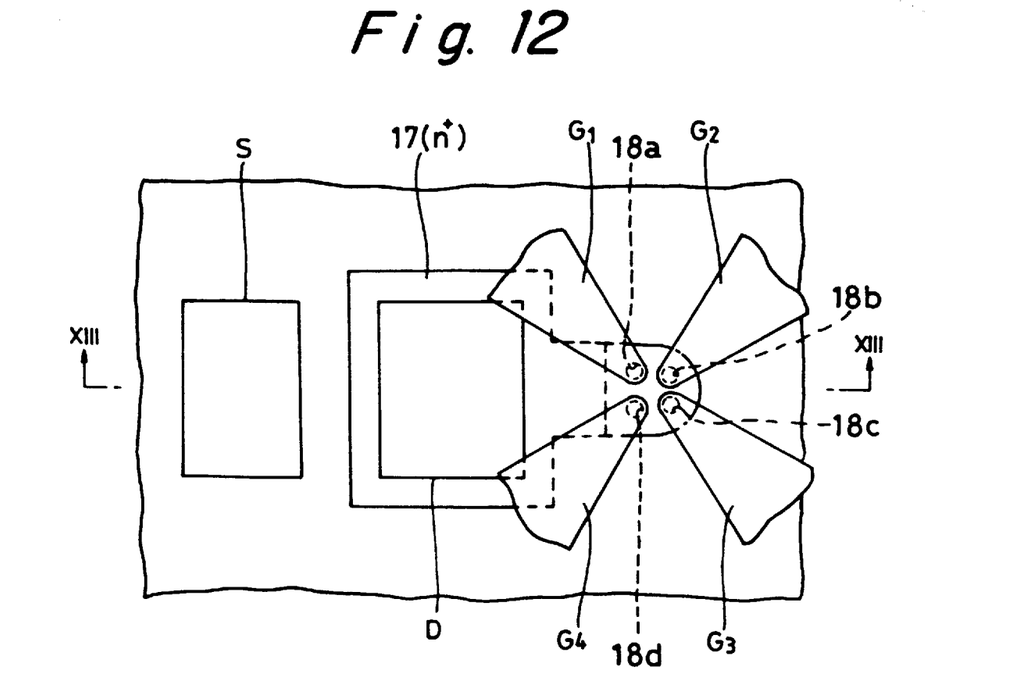
FIG. 12 is a plan view of a quantum interference semiconductor device having forbidden regions in the form of hollows.
Figure 13:
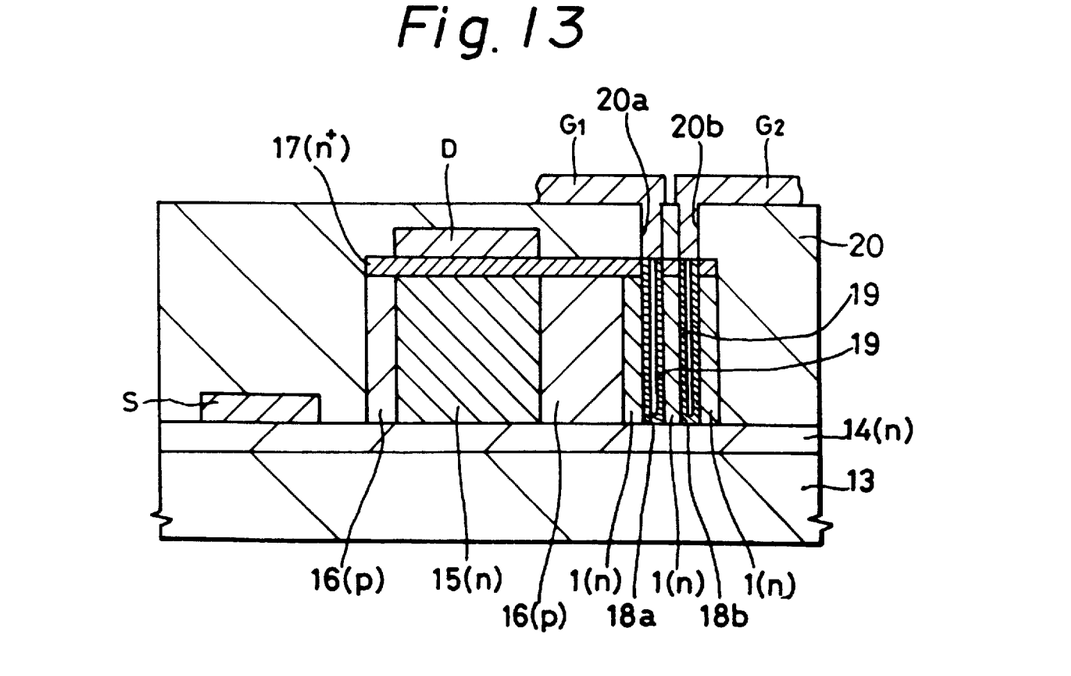
FIG. 13 is a cross sectional view of the quantum interference semiconductor device of FIG. 12, taken along the XIII—XIII line of FIG. 12.

FIG. 12 is a plan view of one example of such a quantum interference semiconductor device. FIG. 13 is a cross sectional view of the quantum interference semiconductor device of FIG. 12, taken along the XIII—XIII line.

As shown in FIGS. 12 and 13, the quantum interference semiconductor device includes an n-type AlGaAs layer 14 stacked on a semi-insulating GaAs substrate 13. Reference numeral 15 refers to an n-type GaAs layer, and 16 to a p-type GaAs layer. Provided on the n-type GaAs layer 15 and the p-type GaAs layer 16 is, for example, an n+-type GaAs layer 17. Reference numerals 18a, 18b, 18c and 18d denote forbidden regions in the form of hollows. The n-type GaAs layer 15 around the forbidden regions 18a, 18b, 18c and 18d constitutes the channel 1. In this case, the drain electrode D is formed on the n+-type GaAs layer 17, and the source electrode S on the n-type AlGaAs layer 14.

Formed on the inner walls of the hollow forbidden regions 18a, 18b, 18c and 18d are Schottky electrodes 19. Alternatively, the Schottky electrodes 19 may be formed to fill the entire inner space of the hollows. Reference numeral 20 denotes an interlayer insulating film made of, for example, $SiO_x$ or $SiN_x$ (not shown in FIG. 12). The interlayer insulating film 20 has openings in locations corresponding to the forbidden regions 18a, 18b, 18c and 18d (FIG. 13 shows openings 20a and 20b alone corresponding to the forbidden regions 18a and 18b). Gate electrodes $G_1$, $G_2$, $G_3$ and $G_4$ are connected to the Schottky electrodes 19 in the forbidden regions 18a, 18b, 18c and 18d through the openings.

In this case, connectivity of the channel 1 may be controlled by varying widths of depletion layers of the Schottky junctions made by the Schottky electrodes 19 and the channel 1 made of n-type GaAs in response to a voltage applied to the Schottky electrodes 19 through the gate electrodes $G_1$, $G_2$, $G_3$ and $G_4$. In addition, the width of each depletion layer around the forbidden regions 18a, 18b, 18c, and 18d can be changed in response to the voltage applied to a corresponding one of the gate electrodes $G_1$, $G_2$, $G_3$ and $G_4$ of a corresponding one of the forbidden regions 18a, 18b, 18c and 18d independently of others.

The quantum interference semiconductor device shown in FIGS. 12 and 13 can be fabricated in the following process.

Figure 14:
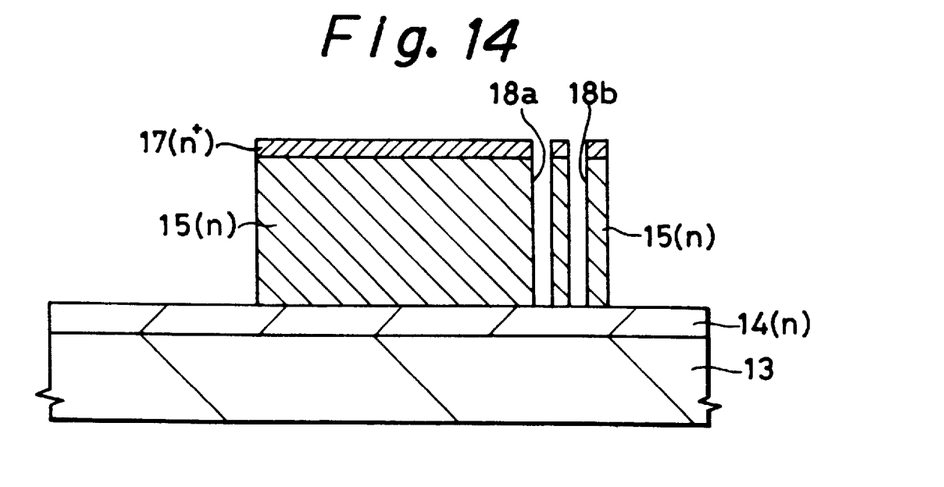
FIG. 14 is a cross sectional view for explaining a method for fabricating the quantum interference semiconductor device of FIGS. 12 and 13.

As shown in FIG. 14, the n-type AlGaAs layer 14, the n-type GaAs layer 15 and the n+-type GaAs layer 17 are epitaxially grown in sequence on the semi-insulating GaAs substrate 13. After that, the n-type GaAs layer 15 and the n+-type GaAs layer 17 are etched into a predetermined configuration, and the forbidden regions 18a, 18b and others in the form of hollows are made.

Figure 15:
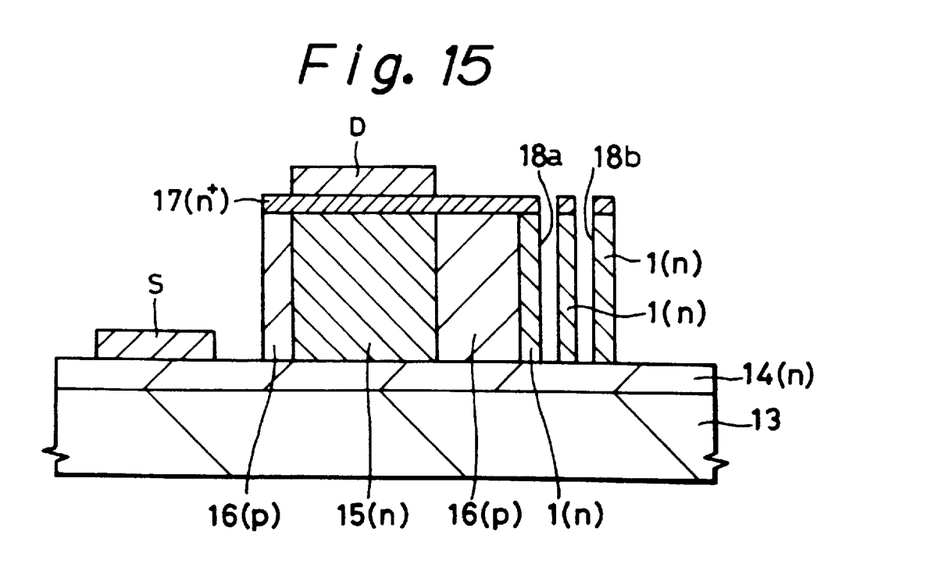
FIG. 15 is a cross sectional view for explaining the method for fabricating the quantum interference semiconductor device of FIGS. 12 and 13.

Next, as shown in FIG. 15, the drain electrode D is formed on the n+-type GaAs layer 17, and the source electrode S on the n-type AlGaAs layer 14. Next, after making a mask (not shown) which has openings at locations corresponding to the n+-type GaAs layer 17 excluding portions near the forbidden regions 18a, 18b and others, a p-type impurity is ion-implanted with energy as large as, for example, making the impurity reach the lowest portion of the n-type GaAs layer 15. In this case, also the drain electrode D in the openings of the mask behaves as a mask such that self-aligned ion implantation with respect to the drain electrode D is performed. As a result of the ion implantation, the p-type GaAs layer 16 is made, and the channel 1 is shaped into the configuration shown in FIGS. 12 and 13 by the p-type GaAs layer 16 made on the side of the forbidden regions 18a, 18b and others.

Next, as shown in FIGS. 13, 14 and 15, after the Schottky electrodes 19 are formed on the inner walls of the forbidden regions 18a, 18b, 18c and 18d, the interlayer insulating film 20 is provided on the entire surface. Next, the predetermined portions of the interlayer insulating film 20 are etched off to form the openings 20a, 20b and others. After that, an Au/Ge alloy film is formed on the entire surface, yet followed by patterning by etching to shape the gate electrodes $G_1$, $G_2$, $G_3$ and $G_4$.

By the foregoing process, a desired quantum interference semiconductor device shown in FIGS. 12 and 13 is finished.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, although the channel 1 used in the described embodiments is made of GaAs, it may be made of a semiconductor other than GaAs. Similarly, forbidden regions 2a, 2b, 2c and 2d may be made of a semiconductor other than AlGaAs.

What is claimed is:

1. A semiconductor device exploiting a quantum interference effect, said device comprising:

a semiconductor body having two ends and a first axis extending between the two ends;

n−1 forbidden regions extending along one direction parallel to the first axis in said semiconductor body between the two ends with n>3, said forbidden regions being positioned asymmetrically around said first axis, each of said forbidden regions having a surrounding depletion layer formed within said semiconductor body, said depletion layers being changeable in response to an applied bias to said forbidden regions directly by a gate electrode to change an effective cross-section of the forbidden regions;

a channel region being within said semiconductor body and outside of said depletion layers;

said channel region having $2^{n-1}$ carrier paths in said channel region, each of said paths forming a continuous closed circuit extending in said one direction and said paths being in portions of the channel region free of the forbidden regions; and a source electrode electrically connected to one of the two ends and a drain electrode electrically connected to the other of the two ends;

so that the effective cross-section of at least one of said forbidden regions can be expanded into another forbidden region by changing said applied bias to reduce the number of forbidden regions and reduce the number of carrier paths within the channel region.

2. A semiconductor device according to claim 1, wherein said forbidden regions excluding said depletion layers are equal in cross sectional area.

3. A semiconductor device according to claim 1, wherein said forbidden regions excluding said depletion layers are spaced apart by different distances.

4. A semiconductor device according to claim 1, wherein said semiconductor device is placed in a magnetic field.

5. A semiconductor device according to claim 1, wherein each of said forbidden regions has an independent gate electrode.

6. A semiconductor device according to claim 1, wherein spacing between surfaces of adjacent forbidden regions are different so that two regions will merge during increasing of the effective cross section before any remaining regions.

7. A semiconductor device according to claim 6, wherein the forbidden regions axes are symmetrically spaced around the one direction and the forbidden regions have different diameters.

8. A semiconductor device according to claim 7, wherein the forbidden regions are rods.

9. A semiconductor device according to claim 6, wherein the forbidden regions have the same diameter.

10. A semiconductor device according to claim 9, wherein the forbidden regions are rods.

11. A semiconductor device exploiting a quantum interference effect, said device comprising:

a semiconductor body having a first axis;

n−1 forbidden regions extending along one direction parallel to the first axis in said semiconductor body with n>3, said forbidden regions being positioned asymmetrically around said first axis, each of said forbidden regions including a depletion layer formed within said semiconductor body, said depletion layers being changeable in response to an applied bias to said depletion layers directly by a gate electrode to change an effective cross-section of the depletion layer;

a channel region being formed within said semiconductor body and outside of said depletion layer; and source and drain electrodes electrically connected to opposite ends of said channel region, so that at least one of said forbidden regions can be expanded into the other forbidden regions to change the number of forbidden regions and carrier paths within said channel region by changing said applied bias.

12. A semiconductor device exploiting a quantum interference effect, said device comprising:

a semiconductor body having two ends and a first axis extending between the two ends;

n−1 forbidden regions extending along one direction parallel to the first axis in said semiconductor body between the two ends with n>3, said forbidden regions being positioned rotationally asymmetrically around said first axis with two of the n−1 forbidden regions having a spacing between surfaces that is less than the spacing between each of the two forbidden regions and the remaining regions and between the remaining regions, each of said forbidden regions having a surrounding depletion layer formed within said semiconductor body, said depletion layers being changeable in response to an applied bias to said forbidden regions directly by a gate electrode to change an effective cross-section of the forbidden regions;

a channel region being within said semiconductor body and outside of said depletion layers;

said channel region having $2^{n-1}$ carrier paths in said channel region, each of said paths forming a continuous closed circuit extending in said one direction and said paths being in portions of the channel region free of the forbidden regions; and a source electrode electrically connected to one of the two ends and a drain electrode electrically connected to the other of the two ends;

so that the effective cross-section of said two forbidden regions can be expanded into each other without merging with the remaining region by changing said applied bias to reduce the number of forbidden regions and reduce the number of carrier paths within the channel region.

* * * * *